(12) United States Patent
Izumi et al.

(10) Patent No.: US 11,599,135 B2
(45) Date of Patent: Mar. 7, 2023

(54) ROTATION OPERATION DEVICE

(71) Applicant: YAMAHA CORPORATION, Hamamatsu (JP)

(72) Inventors: Ryuichi Izumi, Hamamatsu (JP); Yoshihiro Suzuki, Iwata (JP)

(73) Assignee: YAMAHA CORPORATION, Hamamatsu (JP)

( * ) Notice: Subject to any disclaimer, the term of this patent is extended or adjusted under 35 U.S.C. 154(b) by 155 days.

(21) Appl. No.: 17/186,665

(22) Filed: Feb. 26, 2021

(65) Prior Publication Data

US 2021/0286396 A1     Sep. 16, 2021

(30) Foreign Application Priority Data

Mar. 16, 2020   (JP) .............................. JP2020-045710

(51) Int. Cl.
  *G05G 1/10*       (2006.01)
  *G05G 1/015*      (2008.04)
  *H05K 1/18*       (2006.01)

(52) U.S. Cl.
  CPC .............. *G05G 1/10* (2013.01); *G05G 1/015* (2013.01); *H05K 1/18* (2013.01); *H05K 2201/10151* (2013.01); *H05K 2201/10901* (2013.01)

(58) Field of Classification Search
  CPC .. H01H 25/06; H01H 19/025; H01H 2219/06; H01H 2219/066; G05G 1/10;
  (Continued)

(56) References Cited

U.S. PATENT DOCUMENTS 2,688,261 A * 9/1954 Hansen .................. G05G 1/085
                                                         73/290 R
5,765,449 A * 6/1998 LeMire ..................... G05G 1/12
                                                       16/DIG. 40
(Continued)

FOREIGN PATENT DOCUMENTS

DE      202005019978 U1 * 4/2006 ............... F24C 7/08
EP           2874040 A1 * 5/2015 ............... G05G 1/12
(Continued)

OTHER PUBLICATIONS

Machine translation of DE 202005019978 U1, E.G.O. Elecktro Geratebau GmbH, Apr. 20, 2006/ (Year: 2006).*
(Continued)

*Primary Examiner* — Vinh Luong
(74) *Attorney, Agent, or Firm* — Rossi, Kimms & McDowell LLP (57) ABSTRACT

A rotation operation device includes: a rotation shaft including a first end portion and a second end portion spaced apart from each other in an axial direction of the rotation shaft; a knob having conductivity, the knob being provided at the first end portion of the rotation shaft and being configured to rotate the rotation shaft; a touch sensor configured to detect a contact with the knob; and an elastic body having conductivity, the elastic body including a first end connected to the knob and a second end connected to the touch sensor. The knob includes a surface facing in the axial direction of the rotation shaft towards the second end portion of the rotation shaft, the surface of the knob includes a recess portion recessed in the axial direction, and the first end of the elastic body is disposed in the recess portion.

7 Claims, 4 Drawing Sheets

(58) Field of Classification Search
CPC .............. G05G 1/015; H05K 1/18; H05K 2201/10151; H05K 2201/10901
USPC .............................................. 74/553
See application file for complete search history.

(56) References Cited

U.S. PATENT DOCUMENTS

| | | | | |
|---|---|---|---|---|
| 8,217,292 | B2* | 7/2012 | Hamm | H03K 17/962 200/600 |
| 8,217,742 | B2* | 7/2012 | Trudeau | G01D 5/244 335/206 |
| 9,941,078 | B2* | 4/2018 | Lyszus | G06F 3/03547 |
| 2003/0006958 | A1* | 1/2003 | Onodera | G06F 3/016 345/156 |
| 2007/0181410 | A1* | 8/2007 | Baier | F24C 7/082 200/17 R |
| 2010/0194521 | A1 | 8/2010 | Baier | |
| 2017/0074685 | A1* | 3/2017 | Tang-Kong | G01D 5/2415 |

FOREIGN PATENT DOCUMENTS

| | | | | | |
|---|---|---|---|---|---|
| GB | 2071588 | A | * | 9/1981 | ......... G05G 1/10 |
| GB | 2186668 | A | * | 8/1987 | ......... G05G 1/10 |
| JP | 3847684 | B2 | | 11/2006 | |

OTHER PUBLICATIONS

Extended European search report issued in European Appln. No. 21160338.6 dated Aug. 3, 2021.

* cited by examiner

ROTATION OPERATION DEVICE

CROSS-REFERENCE TO RELATED APPLICATIONS

Priority is claimed on Japanese Patent Application No. 2020-045710, filed Mar. 16, 2020, the contents of which are incorporated herein by reference.

BACKGROUND

Field of the Invention

This disclosure relates to a rotation operation device.

Description of Related Art

Japanese Patent Publication No. 3847684 (hereinafter referred to as Patent Document 1) discloses a rotation operation device that includes a rotation shaft (operation shaft) and a knob attached to an upper end of the rotation shaft. The rotation operation device of Patent Document 1 can detect a situation where an operator's finger touches the knob. Specifically, in the rotation operation device of Patent Document 1, the rotation shaft and the knob have conductivity, and a conductive elastic body (coil spring) is interposed between an electrode of a touch sensor that detects contact with the knob, and a lower end of the rotation shaft. As a result, the knob and the touch sensor are electrically connected via the rotation shaft and the elastic body. When the rotation shaft rotates in the rotation operation device of Patent Document 1, the lower end of the rotation shaft and the elastic body rub against each other. Moreover the elastic body and the electrode of the touch sensor rub against each other.

SUMMARY

However, in the rotation operation device of Patent Document 1, dust and water droplets tend to adhere to the contact point between the elastic body and the rotation shaft that rub against each other. If dust or water droplets adhere to the contact point, there is a problem that the electrical connection between the knob and the touch sensor is likely to be defective.

The present disclosure has been made in view of the above circumstances, and an object of embodiments of the present invention is to provide a rotation operation device capable of suppressing an electrical connection failure between a knob and a touch sensor.

According to one aspect of the present invention, a rotation operation device includes: a rotation shaft including a first end portion and a second end portion spaced apart from each other in an axial direction of the rotation shaft; a knob having conductivity, the knob being provided at the first end portion of the rotation shaft and being configured to rotate the rotation shaft; a touch sensor configured to detect a contact with the knob; and an elastic body having conductivity, the elastic body including a first end connected to the knob and a second end connected to the touch sensor. The knob includes a surface facing in the axial direction of the rotation shaft towards the second end portion of the rotation shaft, the surface of the knob includes a recess portion recessed in the axial direction, and the first end of the elastic body is disposed in the recess portion.

Other objects, advantages and novel features of the embodiments of the present invention will become apparent from the following detailed description of one or more preferred embodiments when considered in conjunction with the accompanying drawings, in which:

DETAILED DESCRIPTION

Hereinafter, embodiments will be described with reference to FIGS. 1 to 5.

Figure 1:
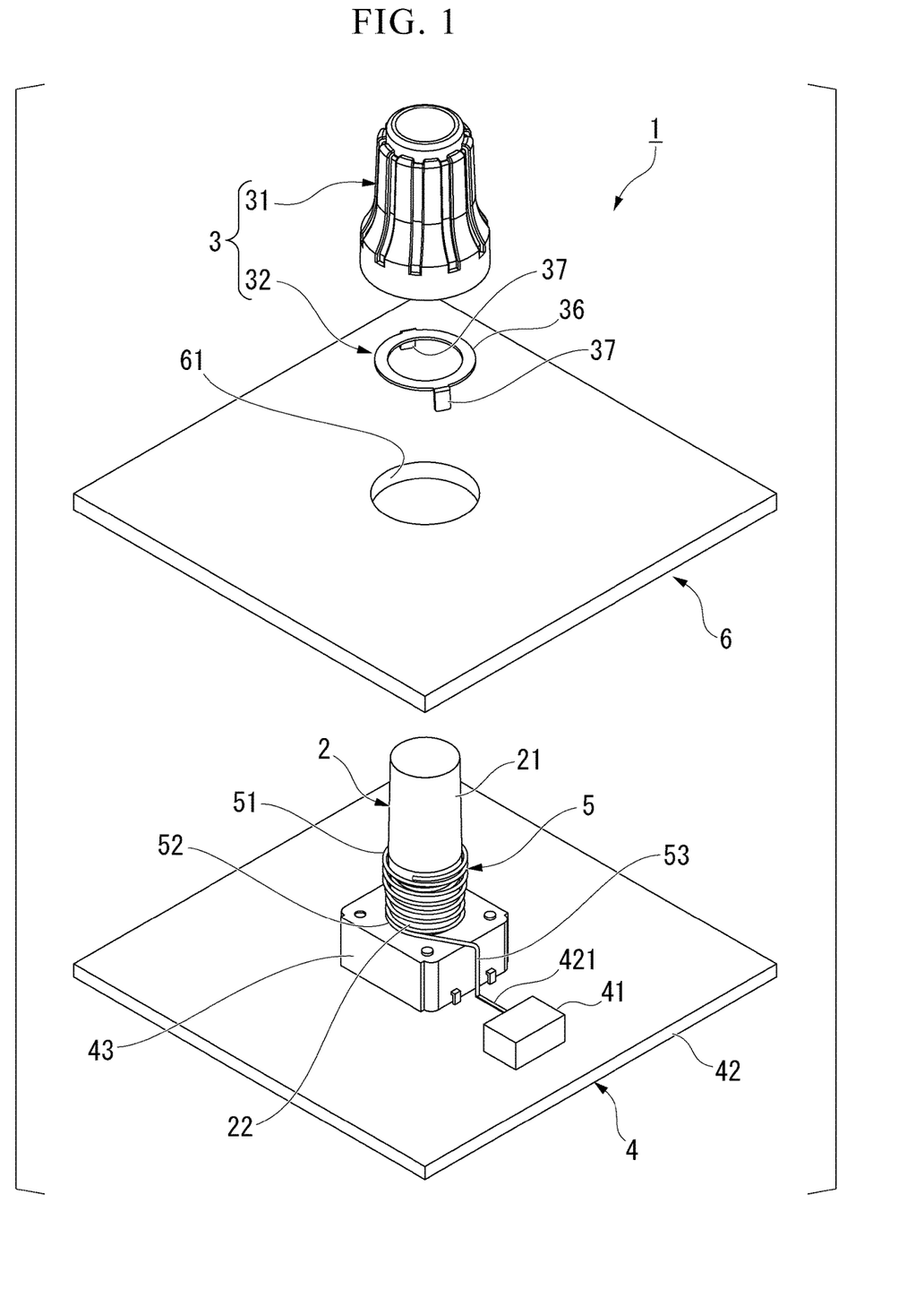
FIG. 1 is an exploded perspective view showing a rotation operation device according to an embodiment.
Figure 2:
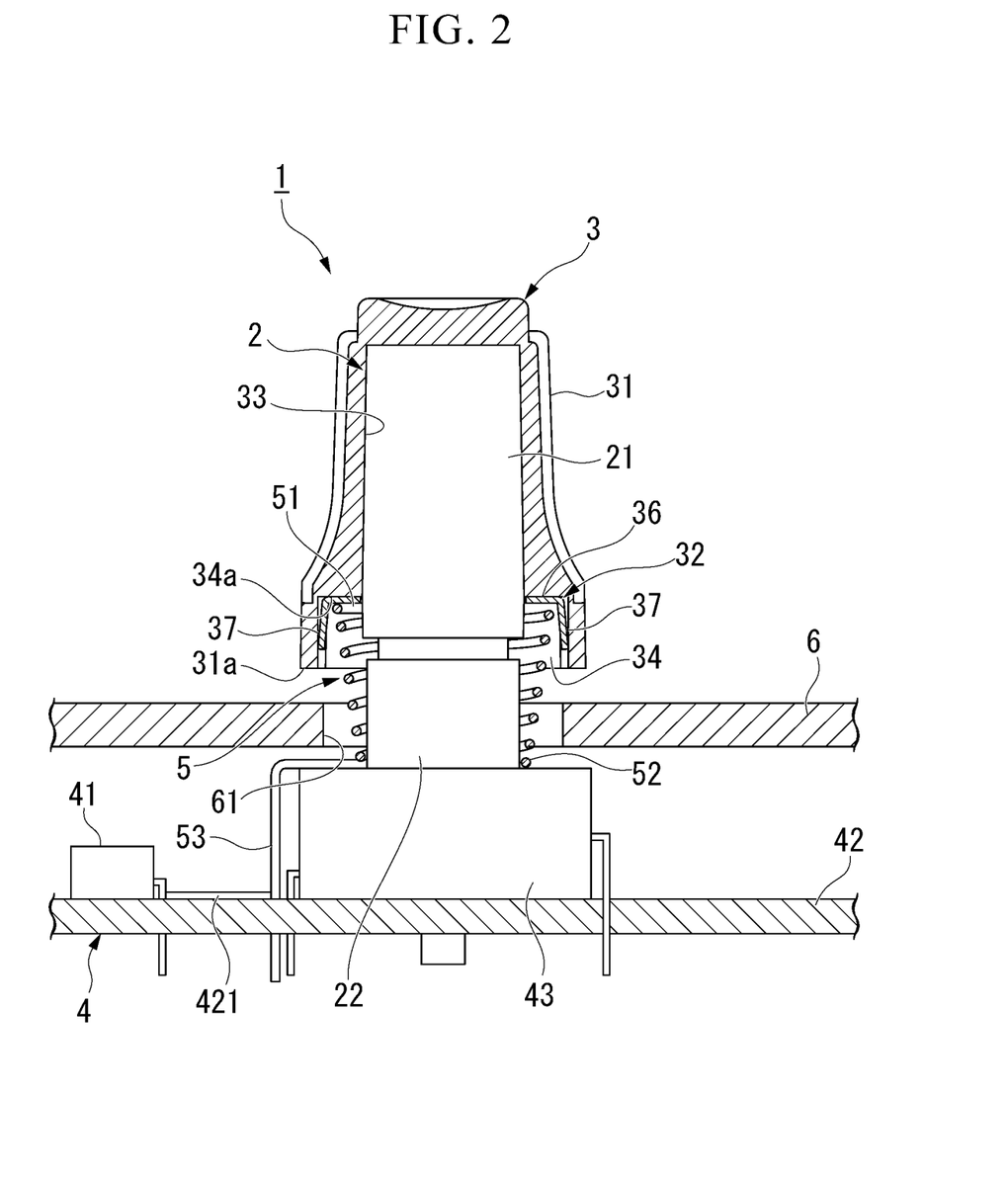
FIG. 2 is a cross-sectional view showing the rotation operation device according to the embodiment.
Figure 5:
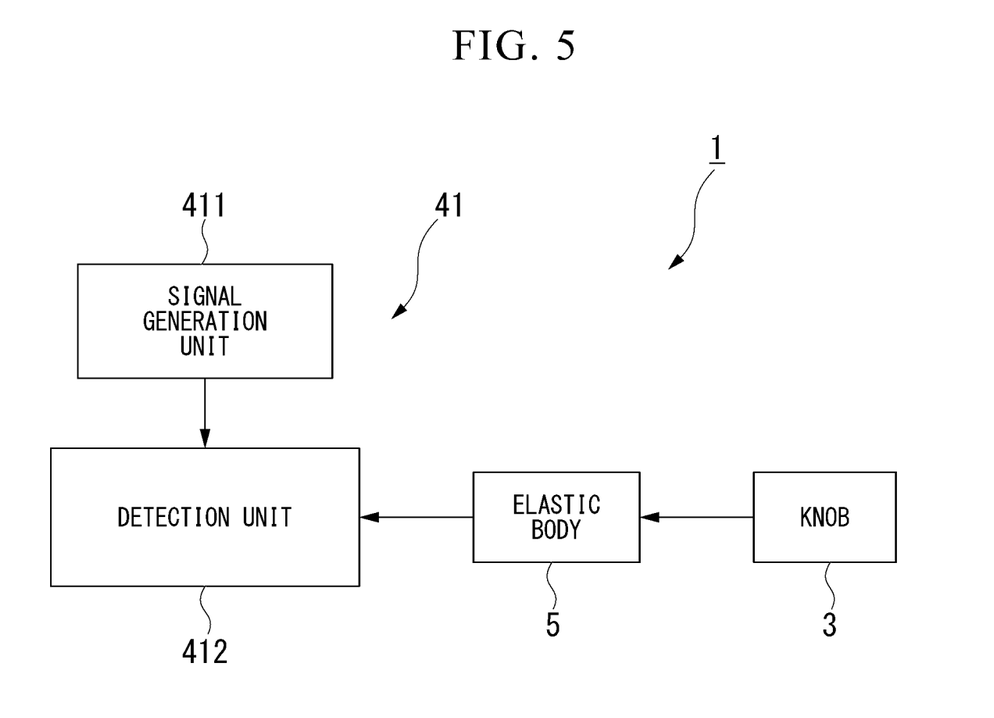
FIG. 5 is a block diagram showing the rotation operation device according to the embodiment.

As shown in FIGS. 1, 2, and 5, a rotation operation device 1 according to an embodiment includes a rotation shaft 2, a knob 3, a touch sensor 41, and an elastic body 5. The rotation operation device 1 of the embodiment includes a base portion 4 that includes the touch sensor 41.

As shown in FIGS. 1 and 2, the rotation shaft 2 is formed in a rod shape extending in the axial direction (vertical direction in FIGS. 1 and 2). The rotation shaft 2 is attached to the base portion 4 so as to be rotatable about the axis of the rotation shaft 2. The rotation shaft 2 extends from the base portion 4 to one side in the axial direction. In other words, the base portion 4 is provided on a base end 22 (second end portion) side in the axial direction of the rotation shaft 2.

The rotation shaft 2 of this embodiment is non-conductive. Specifically, the rotation shaft 2 is made of a resin member having electrical insulating properties such as plastic. Note that the rotation shaft 2 may be made of a conductive material such as metal for example.

Figure 3:
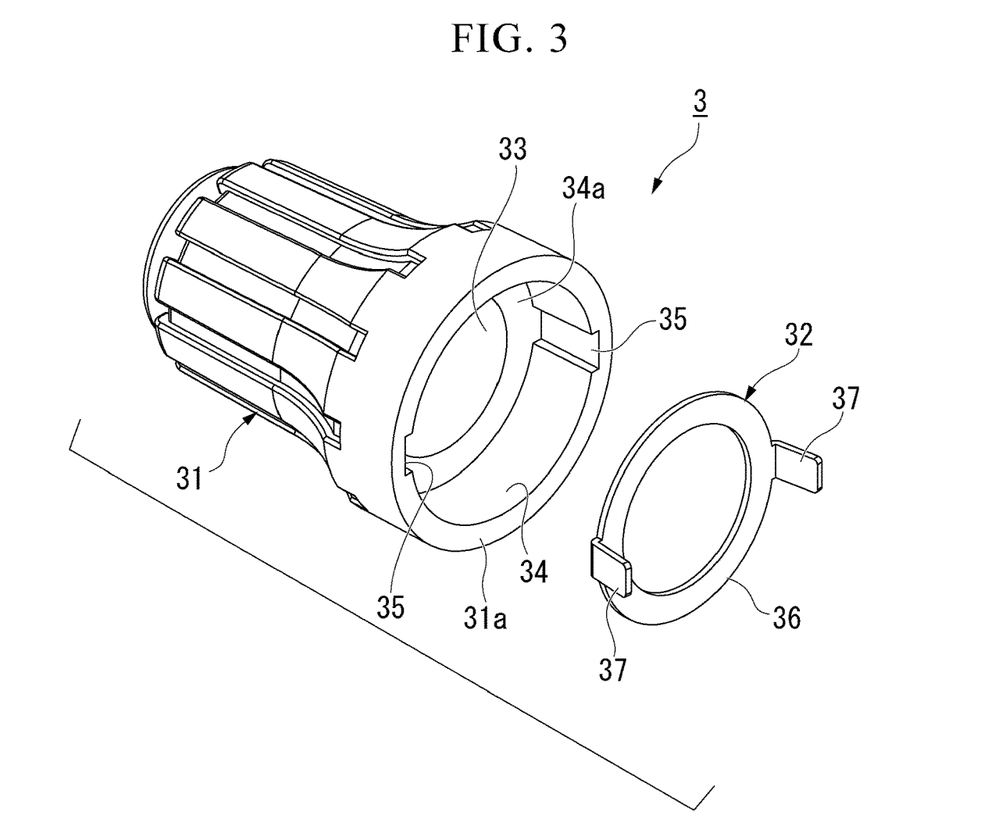
FIG. 3 is an exploded perspective view showing a knob of the rotation operation device of FIGS. 1 and 2.

The knob 3 is a member that the operator of the rotation operation device 1 holds with his or her fingers in order to rotate the rotation shaft 2, and has conductivity. As shown in FIGS. 1 to 3, the knob 3 of the embodiment includes a conductive knob main body 31 and a plate member 32.

The knob main body 31 is larger than the rotation shaft 2 when viewed from the axial direction of the rotation shaft 2. The knob main body 31 is provided at a tip portion 21 (first end portion) in the axial direction of the rotation shaft 2. Specifically, an insertion hole 33 is formed in the knob main body 31. The insertion hole 33 is a hole that has a basement and that is recessed from an end surface 31a of the knob main body 31 facing the base end 22 side (base portion 4 side) of the rotation shaft 2. By inserting a tip portion 21 of the rotation shaft 2 into the insertion hole 33 of the knob main body 31, the knob main body 31 is attached to the tip portion 21 of the rotation shaft 2. The knob main body 31 attached to the rotation shaft 2 is fixed to the rotation shaft 2 and thereby can rotate about the axis of the rotation shaft 2 together with the rotation shaft 2.

The knob main body 31 is formed with a recess portion 34 recessed in from the end surface 31a of the knob main body 31. The recess portion 34 is formed in an annular shape that surrounds the outside of the insertion hole 33 when viewed from the axial direction of the insertion hole 33 (rotation shaft 2). The knob main body 31 is formed with a plurality of (two in the illustrated example) locking grooves 35 that are recessed in from the inner peripheral surface of the recess portion 34. The plurality of locking grooves 35 are each opened in the end surface 31a of the knob main body 31, and are arranged at intervals around the circumferential direction of the recess portion 34.

The knob main body 31 may be, for example, a metal member. In this embodiment, it is formed by subjecting the surface of a resin member such as plastic to conductive plating.

The plate member 32 is fixed to the knob main body 31 in a state of being overlapped on a bottom surface 34a of the recess portion 34 of the knob main body 31. The plate member 32 of the embodiment has a flat plate portion 36 and a plurality of (two in the illustrated example) locking pieces 37 extending from the flat plate portion 36. The flat plate portion 36 is formed in an annular shape corresponding to the bottom surface 34a of the recess portion 34, and is arranged so as to overlap the bottom surface 34a of the recess portion 34.

The thickness direction of the flat plate portion 36 is the direction in which the flat plate portion 36 overlaps the bottom surface 34a of the recess portion 34. Each of the plurality of locking pieces 37 extend from the outer edge of the flat plate portion 36 to one side in the thickness direction of the flat plate portion 36, and the locking pieces 37 are arranged at intervals around the circumferential direction of the flat plate portion 36. Each of the plurality of locking pieces 37 can be elastically displaced in the radial direction with respect to the flat plate portion 36.

The plate member 32 is made of a metal member. The plate member 32 of the embodiment is formed by subjecting the surface of a member made of phosphor bronze to nickel plating.

The plate member 32 is attached to the knob main body 31 by being inserted into the recess portion 34 of the knob main body 31. In the state where the plate member 32 is attached to the knob main body 31, the flat plate portion 36 overlaps the bottom surface 34a of the recess portion 34, and the plurality of locking pieces 37 are inserted into the plurality of locking grooves 35, respectively. In this state, the plurality of locking pieces 37 are pressed against the inner surface of the locking groove 35 formed in the inner peripheral surface of the recess portion 34, by the elastic force of the locking pieces 37. As a result, the plate member 32 is held in the recess portion 34 of the knob main body 31, so that it is possible to prevent the flat plate portion 36 of the plate member 32 from moving to rub against the bottom surface 34a of the recess portion 34.

The touch sensor 41 shown in FIG. 5 detects the presence or absence of contact of the operator's fingers (human body) with the knob 3. The touch sensor 41 of the present embodiment includes a signal generation unit 411 and a detection unit 412. The signal generation unit 411 generates a touch sense signal. The touch sense signal is, for example, a pulse signal generated at a predetermined time interval. The signal generation unit 411 outputs the touch sense signal to the detection unit 412. The detection unit 412 is electrically connected to the knob 3 via the elastic body 5 described later. The detection unit 412 detects the presence or absence of contact with the knob 3 based on a signal output according to the capacitance generated between the knob 3 and the human body with respect to the touch sense signal.

The touch sensor 41 is provided on the base end 22 side of the rotation shaft 2. In the present embodiment, the touch sensor 41 is located on the base end 22 side of the rotation shaft 2 by being included in the base portion 4 attached to the base end 22 side of the rotation shaft 2 (see FIGS. 1 and 2).

As shown in FIGS. 1 and 2, the base portion 4 attached to the base end 22 side of the rotation shaft 2 includes a circuit board 42 and a rotation position detection unit (rotation position detector) 43 in addition to the touch sensor 41 described above. The touch sensor 41 (particularly the detection unit 412) is mounted on the circuit board 42 and connected to wiring 421 of the circuit board 42.

The rotation position detection unit 43 is mounted on the circuit board 42 and connected to the wiring of the circuit board 42, as with the touch sensor 41. The rotation position detection unit 43 is provided on the base end 22 side of the rotation shaft 2, and detects the rotation position (or rotation angle) of the rotation shaft 2. The rotation position detection unit 43 may be one that uses, for example, an optical principle or a magnetic principle.

Figure 4:
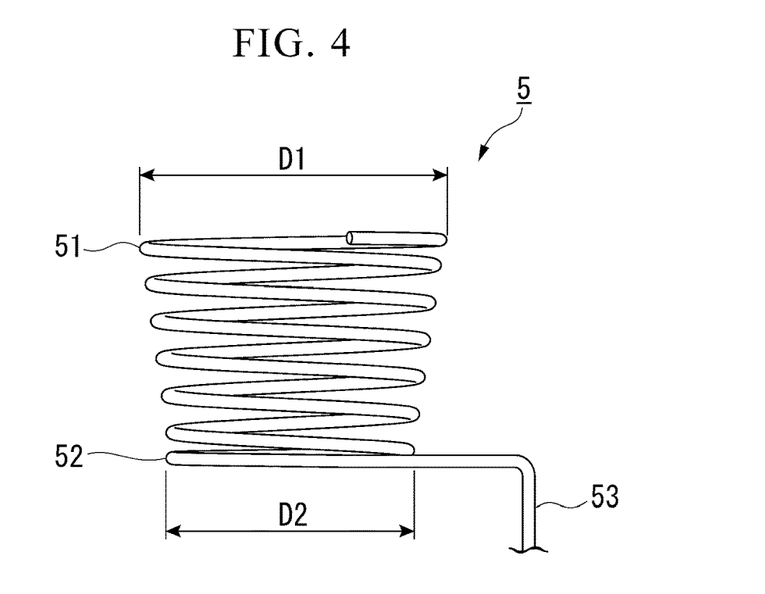
FIG. 4 is a side view showing an elastic body of the rotation operation device of FIGS. 1 and 2.

The elastic body 5 has conductivity. The elastic body 5 of the embodiment is made of a metal member. The elastic body 5 is made of, for example, beryllium steel.

As shown in FIG. 4, the elastic body 5 of the embodiment is a coil spring formed in a cylindrical shape. The diameter dimension D1 of a first end 51 of the elastic body 5 in the axial direction is larger than the diameter dimension D2 of a second end 52 of the elastic body 5. The diameter dimension of the elastic body 5 gradually decreases from the first end 51 to the second end 52 in the axial direction. The diameter dimension of the elastic body 5 may be constant, for example, in the radial direction of the elastic body 5.

The elastic body 5 of the embodiment includes an extension line portion 53 extending in the axial direction from the second end 52 thereof. In this embodiment, the extension line portion 53 is included in the second end 52 of the elastic body 5.

As shown in FIGS. 1 and 2, the elastic body 5 is arranged so that the first end 51 of the elastic body 5 is connected to the knob 3, and the second end 52 of the elastic body 5 is connected to the detection unit 412 of the touch sensor 41. That is, the elastic body 5 electrically connects the knob 3 and the touch sensor 41.

Specifically, the elastic body 5 is arranged so as to surround the outside of the rotation shaft 2, and is sandwiched between the knob 3 provided on the tip portion 21 of the rotation shaft 2, and the rotation position detection unit 43 of the base portion 4 provided on the base end 22 side of the rotation shaft 2. In this state, the part of the elastic body 5 on the first end 51 side is inserted into the recess portion 34 of the knob 3. Further, the first end 51 of the elastic body 5 is pressed against the flat plate portion 36 of the plate member 32 that overlaps the bottom surface 34a of the recess portion 34 of the knob main body 31, by the elastic force of the elastic body 5, and is connected to the knob 3. On the other hand, the second end 52 of the elastic body 5 is pressed against the rotation position detection unit 43 by the elastic force of the elastic body 5. Moreover, the extension wire portion 53 forming the second end 52 of the elastic body 5 extends from the rotation position detection portion 43 to the circuit board 42 and is fixed to the circuit board 42 by soldering. As a result, the second end 52 of the elastic body 5 is connected to the detection unit 412 of the touch sensor 41 via the wiring 421 of the circuit board 42.

From the above, the knob main body 31 and the detection unit 412 of the touch sensor 41 are electrically connected via the plate member 32, the elastic body 5, and the wiring 421 of the circuit board 42.

The rotation operation device 1 of the embodiment further includes a cover member 6. The cover member 6 is arranged between the base portion 4 and the knob 3 in the axial direction of the rotation shaft 2 to cover the base portion 4. The cover member 6 is formed with an insertion hole 61 through which the rotation shaft 2 and the elastic body 5 are inserted. The size of the insertion hole 61 when seen from the axial direction of the rotation shaft 2 is larger than that of the rotation shaft 2 and the elastic body 5, and smaller than that of the knob 3. That is, the insertion hole 61 of the cover member 6 is covered with the knob 3. The cover member 6 may form, for example, a case for accommodating the base portion 4.

As described above, according to the rotation operation device 1 of the embodiment, the elastic body 5 is directly connected to the knob 3 without the intervention of the rotation shaft 2. That is, the contact point between the knob 3 and the first end 51 of the elastic body 5 that rub against each other, is located on the outside of the cover member 6 and on the tip portion 21 side of the rotation shaft 2. Further, since the contact point between the knob 3 and the first end 51 of the elastic body 5 is located on the bottom surface 34a of the recess portion 34 of the knob 3, it is not exposed to the outside of the knob 3. This makes it difficult for dust and water droplets to enter the recess portion 34 of the knob 3. As illustrated in FIG. 2, when the recess portion 34 of the knob 3 is directed downward, and when the end surface 31a of the knob 3 through which the recess portion 34 opens faces the cover member 6, and the distance between the end surface 31a of the knob 3 and the cover member 6 is small, then in particular it becomes difficult for dust and water droplets to enter the recess portion 34 of the knob 3. Therefore, dust and water droplets are less likely to adhere to the contact point between the knob 3 and the first end 51 of the elastic body 5. Hence, it is possible to suppress the occurrence of an electrical connection failure between the knob 3 and the touch sensor 41.

Further, in the rotation operation device 1 of the embodiment, the knob 3 includes the conductive knob main body 31 having the recess portion 34, and the conductive plate member 32 fixed to the knob main body 31 in a state of being overlapped with the bottom surface 34a of the recess portion 34. Therefore, when the knob 3 is rotated, the first end 51 of the elastic body 5 inserted in the recess portion 34, and the plate member 32 rub against each other, and among the knob 3, only the plate member 32 is worn. Therefore, even if an electrical connection failure between the knob 3 and the elastic body 5 occurs due to wear of the knob 3, only the plate member 32 of the knob 3 is replaced, and it is possible to resolve such electrical connection failure between the knob 3 and the elastic body 5, inexpensively and easily.

Further, in the rotation operation device 1 of the embodiment, the elastic body 5 and the plate member 32 are made of (includes) a metal member. Therefore, even if the first end 51 of the elastic body 5 and the plate member 32 rub against each other and are worn, the electrical connection between the elastic body 5 and the plate member 32 can be ensured. If the elastic body 5 and the plate member 32 are formed by subjecting a resin member to conductive plating, the plating is easily peeled off by the elastic body 5 and the plate member 32 rubbing against each other. Therefore it may be difficult to secure an electrical connection between the elastic body 5 and the knob 3.

The knob main body 31 is formed by subjecting the surface of the resin member to conductive plating, and the plate member 32 made of (including) a metal member is overlapped and fixed to the bottom surface 34a of the recess portion 34 of the knob main body 31. Therefore, even if the knob 3 is rotated, the plate member 32 does not rub against the surface of the knob main body 31 (particularly, the bottom surface 34a of the recess portion 34). Therefore, it is possible to suppress or prevent the plating applied to the knob main body 31 from peeling off, and to secure an electrical connection between the knob main body 31 and the plate member 32.

From the above, it is possible to improve the reliability of the electrical connection between the knob 3 (particularly the knob main body 31) and the elastic body 5.

Further, in the rotation operation device 1 of the embodiment, the knob main body 31 is formed by subjecting the surface of the resin member to conductive plating. Therefore, the knob 3 can be manufactured at a lower cost as compared with the case where the knob main body 31 is made of a metal member. Moreover, the weight of the knob 3 can be reduced. By reducing the weight of the knob 3, the knob 3 can be rotated with a smaller force.

Further, in the rotation operation device 1 of the embodiment, the plate member 32 is formed by plating the surface of a member made of (including) phosphor bronze with nickel plating. That is, since the plate member 32 is formed by plating the surface of the metal member with a metal material different from that of the metal member, the plating is difficult to peel off. Further, the elastic body 5 is made of (including) beryllium steel having a hardness lower than that of nickel. Therefore, even if the first end 51 of the elastic body 5 and the plate member 32 rub against each other, a situation where the nickel plating of the plate member 32 peels off can be suppressed.

Further, in the rotation operation device 1 of the embodiment, the cylindrical elastic body 5 is arranged so as to surround the outside of the rotation shaft 2, and the second end 52 of the elastic body 5 is fixed to the base portion 4. Therefore, when the rotation shaft 2 and the knob 3 are rotated, only the first end 51 of the elastic body 5 rubs against the knob 3, but the second end 52 of the elastic body 5 does not rub against the base portion 4. By reducing the rubbing points of the elastic body 5, maintenance and inspection of the rotation operation device 1 (for example, repair for eliminating a poor connection between the knob 3 and the touch sensor 41) can be easily performed.

Moreover, in the rotation operation device 1 of the embodiment, the second end 52 of the elastic body 5 is fixed to the circuit board 42 (base portion 4) by soldering. Therefore, the second end 52 of the elastic body 5 can be easily and securely fixed to the circuit board 42. Moreover, the second end 52 of the elastic body 5 is soldered to the wiring 421 of the circuit board 42 connected to the touch sensor 41, thereby enabling improvement in the reliability of the electrical connection between the elastic body 5 and the touch sensor 41.

Further, in the rotation operation device 1 of the embodiment, the diameter dimension D1 of the first end 51 of the elastic body 5 located on the knob 3 side is larger than the diameter dimension D2 of the second end 52 of the elastic body 5 located on the base portion 4 side. Therefore, the contact area of the first end 51 of the elastic body 5 with respect to the annular bottom surface 34a of the recess portion 34 can be made larger. As a result, the reliability of the electrical connection between the knob 3 and the elastic body 5 can be improved.

Moreover, in a state where the cylindrical elastic body 5 is arranged so as to surround the outside of the rotation shaft 2, the portion on the second end 52 side of the elastic body 5 touches with the outer circumference of the rotation shaft 2. Thereby it is possible to suppress or prevent the portion on the first end 51 side of the elastic body 5 from touching the outer periphery of the rotation shaft 2 while positioning with respect to the rotation shaft 2.

Further, in the rotation operation device 1 of the embodiment, the rotation position detection unit 43 is provided on the base end 22 side of the rotation shaft 2. Therefore, the size and weight of the knob 3 can be reduced as compared with the case where the rotation position detection unit 43 is provided on the tip portion 21 side (knob 3 side) of the rotation shaft 2.

Moreover, in the rotation operation device 1 of the embodiment, the rotation shaft 2 is non-conductive. Therefore, even if the elastic body 5 touches the rotation shaft 2, it is possible to suppress a malfunction of detection by the touch sensor 41 from occurring. For example, when the rotation shaft 2 is conductive, if the elastic body 5 and the rotation shaft 2 are intermittently contacted and electrically connected, a malfunction due to the touch sensor 41 is likely to occur.

Further, in the rotation operation device 1 of the embodiment, the rotation shaft 2 is made of (includes) a resin member which is lighter than a metal member. Therefore, the weight of the rotation shaft 2 can be reduced and the rotation shaft 2 can be rotated with a smaller force.

Although the embodiments have been described in detail above, the present invention is not limited to the above-described embodiment, and various modifications can be made without departing from the spirit of the present invention.

In a rotation operation device of some embodiments, the knob 3 may consist of, for example, only the knob main body 31. That is, the first end 51 of the elastic body 5 may be directly pressed against the bottom surface 34a of the recess portion 34 of the knob main body 31.

In a rotation operation device of some embodiments, the second end 52 of the elastic body 5 does not have to be fixed to, for example, the base portion 4.

In a rotation operation device of some embodiments, the elastic body 5 is not limited to being arranged so as to surround the outside of the rotation shaft 2, and may be arranged next to the rotation shaft 2, for example. In this case, the recess portion 34 of the knob 3 into which the portion on the first end 51 side of the elastic body 5 is inserted may be positioned at a distance from the insertion hole 33 (rotation shaft 2).

In the rotation operation device 1, it is sufficient that the elastic body 5 has at least conductivity for electrically connecting the knob 3 and the touch sensor 41, and elasticity for pressing the elastic body 5 against the knob 3, and may be, for example, elastic rubber or the like having conductivity.

The rotation operation device 1 may have, for example, the function of a push button switch that pushes the rotation shaft 2 toward the base portion 4 side. That is, the rotation shaft 2 may be movable with respect to the base portion 4 in the axial direction of the rotation shaft 2.

According to some embodiments of the present invention, it is possible to suppress an electrical connection failure between the knob and the touch sensor.

What is claimed is:

1. A rotation operation device comprising:
a rotation shaft including a first end portion and a second end portion spaced apart from each other in an axial direction of the rotation shaft;
a knob having conductivity, the knob being provided at the first end portion of the rotation shaft and being configured to rotate the rotation shaft;
a touch sensor configured to detect a contact with the knob; and
an elastic body having conductivity, the elastic body including a first end connected to the knob and a second end connected to the touch sensor,
wherein the knob includes a surface facing in the axial direction of the rotation shaft towards the second end portion of the rotation shaft, the surface of the knob includes a recess portion recessed in the axial direction, and the first end of the elastic body is disposed in the recess portion, and
wherein the knob includes:
a knob main body having conductivity, the knob main body including the recess portion and being attached to the first end portion of the rotation shaft; and
a plate member having conductivity, the plate member being fixed to the knob main body at a bottom surface of the recess portion.

2. The rotation operation device according to claim 1, wherein each of the elastic body and the plate member includes a metal member, and
the knob main body includes a conductively plated resin member.

3. The rotation operation device according to claim 1, wherein the elastic body has a cylindrical shape and surrounds the outer peripheral surface of the rotation shaft, and
a diameter of the first end of the elastic body is larger than a diameter of the second end of the elastic body.

4. The rotation operation device according to claim 1, further comprising a rotation position detector configured to detect a rotation position of the rotation shaft.

5. The rotation operation device according to claim 1, wherein the rotation shaft is non-conductive.

6. A rotation operation device comprising:
a rotation shaft including a first end portion and a second end portion spaced apart from each other in an axial direction of the rotation shaft;
a knob having conductivity, the knob being provided at the first end portion of the rotation shaft and being configured to rotate the rotation shaft;
a touch sensor configured to detect a contact with the knob;
a base portion that includes the touch sensor; and
an elastic body having conductivity, the elastic body including a first end connected to the knob and a second end connected to the touch sensor,
wherein the knob includes a surface facing in the axial direction of the rotation shaft towards the second end portion of the rotation shaft, the surface of the knob includes a recess portion recessed in the axial direction, and the first end of the elastic body is disposed in the recess portion, and
wherein the elastic body has a cylindrical shape and surrounds an outer peripheral surface of the rotation shaft, and
the second end of the elastic body is fixed to the base portion.

7. The rotation operation device according to claim 6, wherein the elastic body includes a coil spring that surrounds the outer peripheral surface of the rotation shaft, and the second end of the elastic body is soldered to the base portion.

\* \* \* \* \*